United States Patent
Song

(10) Patent No.: US 8,917,113 B1
(45) Date of Patent: Dec. 23, 2014

(54) PHASE DETECTION DEVICE AND PHASE DETECTION METHOD

(71) Applicant: SK Hynix Inc., Icheon-si, Gyeonggi-do (KR)

(72) Inventor: Keun Soo Song, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/231,060

(22) Filed: Mar. 31, 2014

(30) Foreign Application Priority Data

Sep. 24, 2013 (KR) .................... 10-2013-0113109

(51) Int. Cl.
*H03D 13/00* (2006.01)
*G01R 25/00* (2006.01)

(52) U.S. Cl.
CPC .................... *G01R 25/00* (2013.01)
USPC .......... 327/3; 327/2; 327/7; 327/12; 365/193; 365/233.1

(58) Field of Classification Search
USPC ............ 327/2, 3, 7, 9, 10, 12; 365/193, 233.1
See application file for complete search history.

(56) References Cited

U.S. PATENT DOCUMENTS

| 7,450,443 | B2 * | 11/2008 | Cheng | 365/193 |
| 8,824,223 | B2 * | 9/2014 | Lee | 365/193 |
| 2012/0250434 | A1 * | 10/2012 | Song | 365/193 |

* cited by examiner

*Primary Examiner* — Patrick O'Neill
(74) *Attorney, Agent, or Firm* — William Park & Associates Patent Ltd.

(57) ABSTRACT

A phase detection device includes a clock divider configured to divide a clock signal and generate a plurality of divided clock signals, a recoverer configured to generate a recovered clock signal having substantially the same frequency as the clock signal based on the plurality of divided clock signals, and a phase detector configured to detect a phase of the recovered clock signal in response to a data strobe signal.

20 Claims, 11 Drawing Sheets

PHASE DETECTION DEVICE AND PHASE DETECTION METHOD

CROSS-REFERENCES TO RELATED APPLICATION

The present application claims priority under 35 U.S.C. §119(a) to Korean application number 10-2013-0113109, filed on Sep. 24, 2013, in the Korean Intellectual Property Office, which is incorporated herein by reference in its entirety.

TECHNICAL FIELD

Various embodiments relate to a phase detection device and a phase detection method, and more particularly, to a phase detection device including a divider and a phase detection method of recovering divided signals.

BACKGROUND

An electronic appliance includes various operation units for performing various operations.

In many cases, the operation units may be disposed in different locations. Signal coupling lines typically provide electrical coupling with the operation units. Different signal coupling lines associated with the each of the individual operation units may have different characteristics. As the operation speed of an electronic appliance increases, operation signals commonly provided to operation units may not be provided at substantially the same time.

SUMMARY

In an embodiment, a phase detection device includes a clock divider configured to divide a received clock signal and generate a plurality of divided clock signals, a recoverer configured to generate a recovered clock signal having substantially the same frequency as the clock signal based on the plurality of divided clock signals, and a phase detector configured to detect a phase of the recovered clock signal in response to a data strobe signal.

In an embodiment, a phase detection system includes a controller configured to generate a clock signal and an external data strobe signal, and a phase detection device configured to receive the clock signal and the external data strobe signal, responsively generate a plurality of divided clock signals and a plurality of data strobe signals, generate a recovered clock signal having substantially the same frequency as the clock signal based on the divided clock signals, detect a phase of the recovered clock signal based on the plurality of data strobe signals, and generate a phase detection result.

In an embodiment, a phase detection method includes receiving a clock signal and an external data strobe signal, dividing the received clock signal to generate a plurality of divided clock signals, generating a recovered clock signal having substantially the same frequency as the clock signal based on the plurality of divided clock signals, and detecting a phase of the recovered clock signal based on the external data strobe signal.

DETAILED DESCRIPTION

Embodiments of a phase detection device and a phase detection method will be described below with reference to the accompanying drawings.

Figure 1:
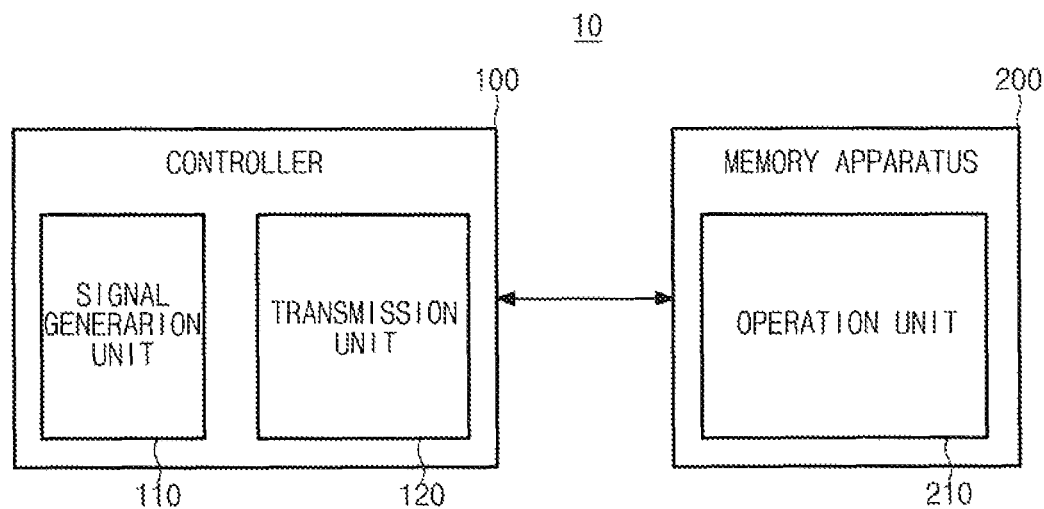
FIG. 1 is a block diagram representation of an embodiment of a phase detection system.

Referring to FIG. 1 a block diagram representation of an embodiment of a phase detection system 10 is shown.

An embodiment of a phase detection system 10 may include a controller 100 and a memory apparatus 200.

The controller 100 generates and transmits a number of different signals for controlling the operation of the memory apparatus 200. An embodiment of the controller 100 may include a signal generation unit 110 and a transmission unit 120.

The signal generation unit 110 generates a number of different signals including control signals. When the controller 100 is placed in a phase detection mode, the controller 100 provides a command signal, clock signals CLK, CLKB and external data strobe signals DQS, DQSB to the memory apparatus 200. In an embodiment, the controller 100 may provide the clock signals CLK, CLKB to the memory apparatus 200 regardless of the operation mode of the controller 100.

In an embodiment, the controller 100 provides the clock signals CLK, CLKB. The clock signal CLK is provided by a clock and the clock signal CLKB is provided by an inverted clock. The controller 100 provides the external data strobe signals DQS, DQSB. The external data strobe signal DQS is provided by a strobe and the external data strobe signal DQSB is provided by an inverted strobe. The clock signals CLK, CLKB and the external data strobe signals DQS, DQSB are differentially provided.

The clock signals CLK, CLKB may correspond to first control signals and the external data strobe signals DQS, DQSB may correspond to second control signals. The clock signals CLK, CLKB and the external data strobe signals DQS, DQSB are provided by the controller 100 to the memory apparatus 200.

The controller 100 may control the generation times and the edge generation times of the clock signals CLK, CLKB based on a phase detection result PD received from the memory apparatus 200. The controller 100 may control the generation times and the edge generation times of the external data strobe signals DQS, DQSB based on a phase detection result PD received from the memory apparatus 200.

In an embodiment, the signal generation unit 110 may include an encoder (not shown). In an embodiment, the encoder may determine the generation times of the clock signals CLK, CLKB and the external data strobe signals DQS, DQSB. The transmission unit 120 receives the signals generated by the signal generation unit 110 and transmits the received signals from the controller 100 to the memory apparatus 200.

The memory apparatus 200 includes at least one operation unit 210. When the memory apparatus 200 includes a plurality of operation units 210, the plurality of operation units 210 may perform substantially similar operations or may perform different operations as independent operation units.

In an embodiment, the plurality of operation units 210 may include memory modules (not shown) for storing data. Each of the memory modules may operate independently in accordance with control signals received from the controller 100. The memory modules may include volatile and/or nonvolatile memory cells for storing data.

The operation units 210 at the memory apparatus 200 may receive the control signals from the controller 100 and transmit signals to the controller 100 via a plurality of signal coupling lines. The plurality of signal coupling lines electrically couples the controller 100 with the memory apparatus 200.

The controller 100 transmits the control signals to the plurality of operation units 210 at the memory apparatus 200. Examples of control signals may include, but are not limited to, clock signals, command signals, address signals, and data strobe signals.

The control signals may be commonly or individually provided to the operation units 210 at the memory apparatus 200. Commonly provided control signals are intended to be provided to multiple operation units 210. In an embodiment, the commonly provided control signals are intended to be provided to all of the operation units 210 at the memory apparatus 200. In an embodiment, the commonly provided control signals are intended to be provided to a subset of all of the operation units 210 at the memory apparatus 200. Individually provided signals are intended to be provided to a specific operation unit 210.

For example, the controller 100 and the memory apparatus 200 may be disposed on separate chips. The controller 100 and the memory apparatus 200 may transmit and receive signals via signal coupling lines. The signal coupling lines may include pins. Control signals may be commonly provided. Commonly provided control signals are transmitted from the controller 100 to the memory apparatus 200 via a single signal coupling line. The commonly provide control signals are received at the memory apparatus 200 and provided to the different operation units 210 via separate signal paths within the memory apparatus 200. This configuration may be referred to as a fly-by design.

Individually provided control signals are individually transmitted from the controller 100 to a specific operation unit 210 via a signal coupling line that electrically couples the controller 100 to the specific operation unit 210.

The transmission of the control signals will be described in greater detail below with reference to FIG. 2.

Figure 2:
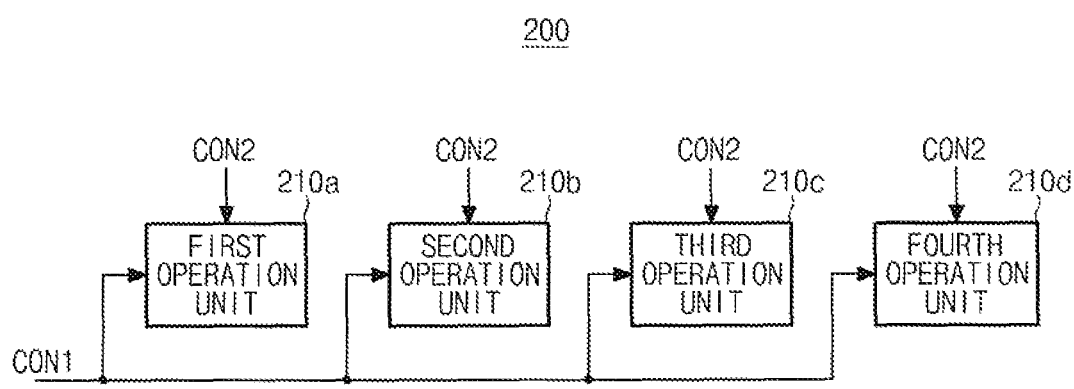
FIG. 2 is a block diagram representation of a plurality of operation units at a memory apparatus detailing the paths of the control signals provided from a controller to the operation units.

Referring to FIG. 2 a block diagram representation of a plurality of operation units 210a, 210b, 210c, 210d detailing the paths of the control signals received from a controller 100 and forwarded to the different operation units at the memory apparatus 200 is shown.

There are two types of signals received from the controller 100 for transmission to the plurality of operation units 210a, 210b, 210c, 210d.

In an embodiment, the two types of control signals may include a first control signal CON1 and a second control signal CON2. The first control signal CON1 is sequentially provided via different paths to each of the operation units 210a, 210b, 210c, 210d. The second control signal CON2 is provided to each of the operation units 210a, 210b, 210c, 210d via signal coupling lines associated with specific operation units 210a, 210b, 210c, 210d.

In an embodiment, the controller 100 is electrically coupled to each operation unit 210a, 210b, 210c, 210d via an individual signal coupling line associated with that operation unit 210a, 210b, 210c, 210d. The second control signal CON2 may be individually transmitted from the controller 100 to the each of the operation units 210a, 210b, 210c, 210d via the individual signal coupling line associated with that operation unit 210a, 210b, 210c, 210d. Each operation unit 210a, 210b, 210c, 210d may have a dedicated terminal or pin for receiving the second control signal CON2 from the controller 100.

In an embodiment, the controller 100 is electrically coupled to the operation units 210a, 210b, 210c, 210d via a common coupling line. In an embodiment, the controller 100 is electrically coupled to the operation units 210a, 210b, 210c, 210d via a common terminal or common pin. The first control signal CON1 may be received by the memory apparatus 200 via the common signal coupling line where the common signal coupling line includes the common terminal or the common pin. The controller 100 may transmit the first control signal CON1 to the memory apparatus 200 via the common signal coupling line. Signal paths branched internally within the memory apparatus 200 may be employed to transmit the first control signal CON1 received via the common signal coupling line to the individual operation units 210a, 210b, 210c, 210d.

The first control signal CON1 is received by the operation units 210a, 210b, 210c, 210d via the common signal coupling line while the second control signal CON2 is received by the operation units 210a, 210b, 210c, 210d via individual signal coupling lines. The first control signal CON1 and the second control signal CON2 may reach the operation units 210a, 210b, 210c, 210d at different times. There may be a phase difference between the first control signal CON1 and the second control signal CON2 by the time the first control signal CON1 and the second control signal CON2 are received at the operation units 210a, 210b, 210c, 210d.

Since the first control signal CON1 is provided to the operation units 210a, 210b, 210c, 210d via different signal paths, it may take relatively longer for the first control signal CON1 to reach the fourth operation unit 210d than for the first control signal CON1 to reach the first operation unit 210a. The second control signal CON2 typically reaches the operation units 210a, 210b, 210c, 210d at substantially the same time.

The phase detection system 10 generally synchronizes the phase of the first control signal CON1 with the phase of second control signal CON2 at each of the operation units 210a, 210b, 210c, 210d.

The phase differences between the first control signal CON1 and the second control signal CON2 at each of the individual operation units 210a, 210b, 210c, 210d may vary. A phase detecting operation is performed for each of the individual operation units 210a, 210b, 210c, 210d.

The phase differences between the first control signal CON1 and the second control signal CON2 may be caused by a number of different factors. For example the phase differences and/or the times at which the phases are detected may vary due to differences in the signal paths described above, signal integrity, or the characteristics of reception buffers which receive the first control signal CON1 and the second control signal CON2 at the operation units 210a, 210b, 210c, 210d.

Factors that determine signal integrity may include, but are not limited to, noise, a signal transmission time, and electromagnetic interface (EMI). Signal integrity characteristics may vary according to the path shapes of signal coupling lines via which the first control signal CON1 is provided and characteristics of adjacent circuits. The ability to detect the level of the second control signal CON2 may vary based on the characteristics of the individual reception buffers.

In an embodiment, the first control signal CON1 may correspond to the clock signals CLK, CLKB, and the second control signal CON2 may correspond to the external data strobe signals DQS, DQSB. The external data strobe signals DQS, DQSB may generate pulses at specific times. The clock signals CLK. CLKB may oscillate with a predetermined cycle. The types of the first control signal CON1 and the second control signal CON2 are not limited to clock signals CLK, CLKB and external data strobe signals DQS, DQSB, respectively. The first and second control signals CON1, CON2 may be other types of signals.

Figure 3:
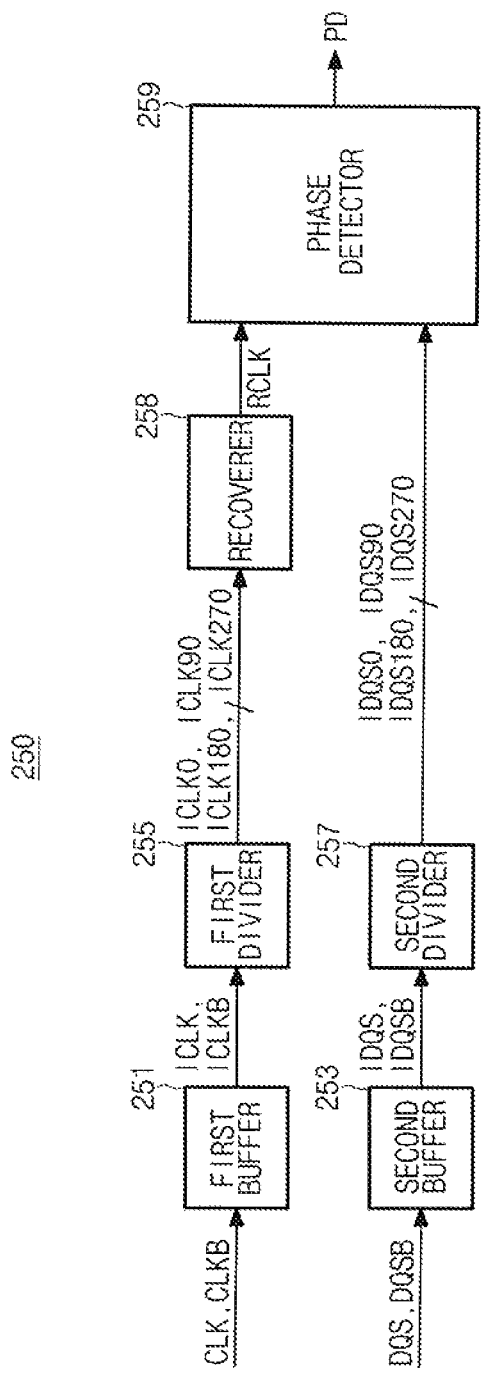
FIG. 3 is a block diagram representation of an embodiment of a phase detection device disposed in an operation unit.

Referring to FIG. 3, a block diagram representation of an embodiment of a phase detection device 250 disposed in an operation unit 210 is shown.

A phase detection device 250 may include a first divider 255, a second divider 257, a recoverer 258, and a phase detector 259.

As described above with reference to FIG. 1, a pair of differential clock signals—a clock signal CLK and an inverted clock signal CLKB—are transmitted from the controller 100 and received at the first divider 255 as an internal clock signal ICLK and an inverted internal clock signal ICLKB. The first divider 255 receives the internal clock signal ICLK and inverted clock signal ICLKB as inputs, divides each of these by two and generates four divided clock signals ICLK0, ICLK90, ICLK180, ICLK270. While in the described embodiment, the received clock signals have been divided by two, in alternative embodiments, the received clock signals may be divided by other numbers.

The use of the divided clock signals ICLK0, ICLK90, ICLK180, ICLK270 is not limited to operations associated with the phase detection device 250 and may be used in operations associated with other components of the memory apparatus 200.

In an embodiment, the phases of the divided clock signals ICLK0, ICLK90, ICLK180, ICLK270 may be detected in response to a data strobe. When the divided clock signals ICLK0, ICLK90, ICLK180, ICLK270 have a logic high state, the individual divided clock signals ICLK0, ICLK90, ICLK180, ICLK270 may be adjacent to a rising edge or adjacent to a falling edge. The phases of the individual divided clock signals ICLK0, ICLK90, ICLK180, ICLK270 may be different from one another.

The recoverer 258 receives the divided clock signals ICLK0, ICLK90, ICLK180, ICLK270 and generates a recovered clock signal RCLK having substantially the same frequency as the clock signal CLK and the inverted clock signal CLKB. It may be possible to detect substantially the same phase with respect to any one of the divided clock signals ICLK0, ICLK90, ICLK180, ICLK270.

The recoverer 258 may include a plurality of logical operators. The plurality of logical operators may be used to perform logical operations with respect to the divided clock signals ICLK0, ICLK90, ICLK180, ICLK270, and generate the recovered clock signal RCLK.

External data strobe signals—an external data strobe signal DQS and an inverted external data strobe signal DQSB—are transmitted from the controller 100 and received at the second divider 257 as an internal data strobe signal IDQS and an inverted internal data strobe signal IDQSB. The second divider 257 receives the internal data strobe signal IDQS and the inverted internal data strobe signal IDQSB, generates a plurality of divided data strobe signals IDQS0, IDQS90, IDQS180, IDQS270. The second divider 257 provides the plurality of divided data strobe signals IDQS0, IDQS90, IDQS180, IDQS270 to the phase detector 259.

The external data strobe signals DQS, DQSB may be provided as a pair of differential external data strobe signals, the external data strobe signal DQS and the inverted external data strobe signal DQSB.

The second divider 257 may receive the internal data strobe signal IDQS and the inverted internal data strobe signal IDQSB as inputs, divide each of the received internal data strobe signals IDQS, IDQSB by two, generate the four divided data strobe signals IDQS0, IDQS90, IDQS180, IDQS270, and provide the four divided data strobe signals IDQS0, IDQS90, IDQS180, IDQS270 to the phase detector 259.

While in the described embodiment, the internal data strobe signals IDQS, IDQSB have been divided by two, in alternative embodiments, the second divider 257 may divide the data strobe signal IDQS and the inverted data strobe signal IDQSB by other numbers.

The phase detector 259 detects the phase of the recovered clock signal RCLK in response to at least one of the divided data strobe signals IDQS0, IDQS90, IDQS180, IDQS270. The phase detector 259 generates a phase detection result PD based on the detected phase. The phase detection result PD may be provided from the memory apparatus 200 to the signal generation unit 110 at the controller 100. The signal generation unit 110 may responsively generate the clock signals CLK, CLKB and the external data strobe signals DQS, DQSB by adjusting the generation time of one of more of the signals CLK, CLKB, DQS, DQSB based on the phase detection result PD.

In an embodiment, the phase detection device 250 may include a first buffer 251. The first buffer 251 receives the clock signal CLK and the inverted clock signal CLKB as inputs and generates the internal clock signal ICLK and the inverted internal clock signal ICLKB. The second buffer 253 receives the external data strobe signal DQS and the inverted external data strobe signal DQSB as inputs and generates the internal data strobe signal IDQS and the inverted internal data strobe signal IDQSB.

The first buffer 251 and the second buffer 253 may each include two reception buffers to receive the differential signals.

Figure 4:
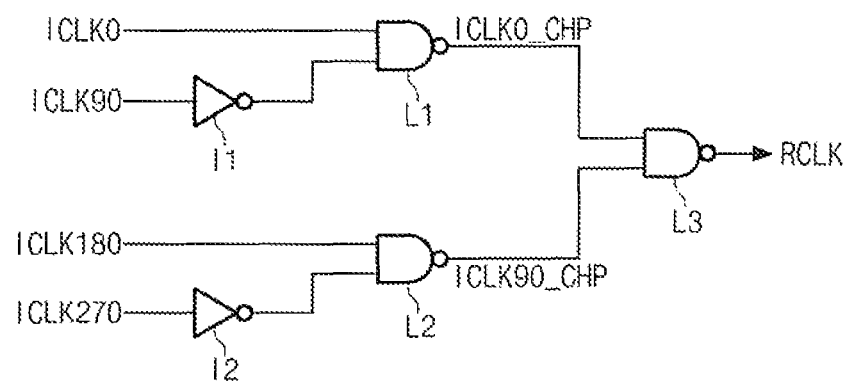
FIG. 4 is a circuit diagram of an embodiment of the recoverer shown in FIG. 3.

FIG. 4 is a circuit diagram of an embodiment of the recoverer 258 shown in FIG. 3.

The recoverer 258 may include a plurality of logical operators. The plurality of logical operators may be used to perform logical operations with respect to the divided clock signals ICLK0, ICLK90, ICLK180, ICLK270, and generate the recovered clock signal RCLK.

The first inverter I1 receives the second divided clock signal ICLK90 as an input and generates an inverted second divided clock signal ICLK90. The first divided clock signal ICLK0 and the inverted second divided clock signal ICLK90 are provided to a first logical operator L1 as inputs.

The first logical operator L1 performs a logical operation, such as for example a NAND operation, and generates a first intermediate recovered signal ICLK0_CHP.

The second inverter I2 receives the fourth divided clock signal ICLK270 as an input and generates an inverted fourth divided clock signal ICLK270. The third divided clock signal ICLK180 and the inverted fourth divided clock signal ICLK270 are provided to a second logical operator L2 as inputs.

The second logical operator L2 performs a logical operation, such as for example a NAND operation, and generates a second intermediate recovered signal ICLK90_CHP.

The first intermediate recovered signal ICLK0_CHP and the second intermediate recovered signal ICLK90_CHP are provided to a third logical operator L3 as inputs. The third logical operator L3 performs a logical operation, such as for example a NAND operation, and generates the recovered clock signal RCLK.

Figure 5:
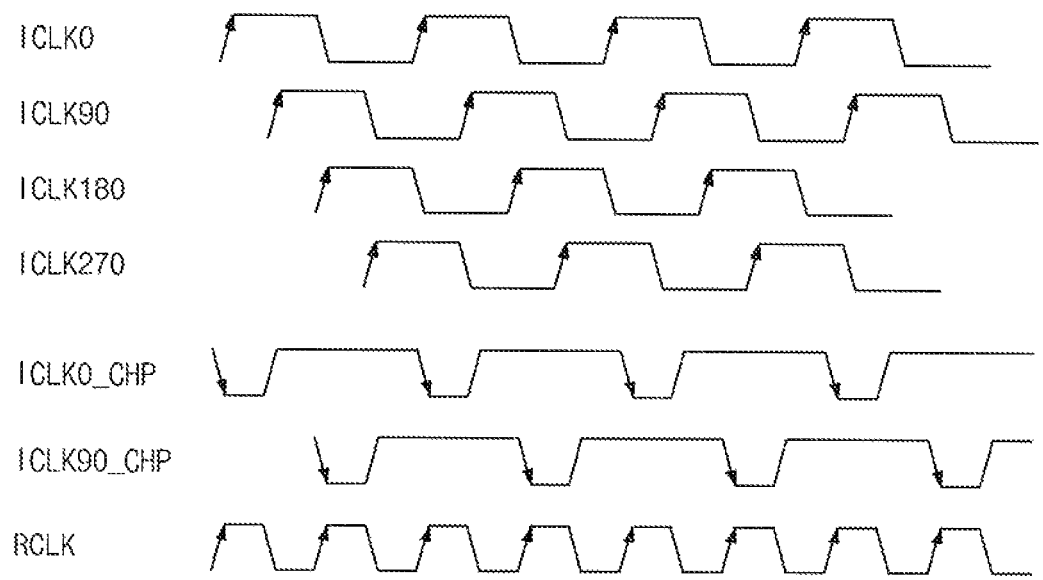
FIG. 5 is a timing diagram illustrating the relationship between the signals generated by the performance of the operations by the recoverer shown in FIG. 4.

Referring to FIG. 5, a timing diagram illustrating the signals generated by the performance of the operations by the recoverer 258 of FIG. 4 is shown.

The performance of the logical operations for the plurality of divided clock signals ICLK0, ICLK90, ICLK180, ICLK270 results in the generation of the recovered clock signal RCLK. The recovered clock signal RCLK has substantially the same frequency as the frequency of the clock signals CLK, CLKB prior to the performance of the division by the first divider 255.

Figure 6:
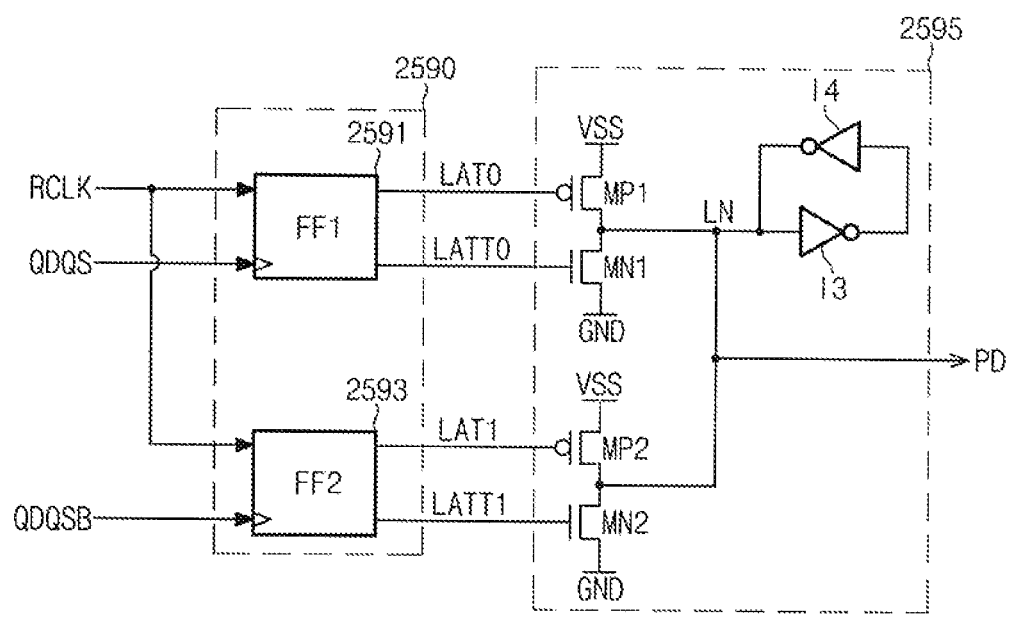
FIG. 6 is a circuit diagram of an embodiment of the phase detector shown in FIG. 3.

FIG. 6 is a circuit diagram of an embodiment of the phase detector 259 shown in FIG. 3.

The phase detector 259 includes an edge-synchronized phase detector 2590 and a detection result outputter 2595.

The edge-synchronized phase detector 2590 selects a pair of signals from among the divided data strobe signals IDQS0, IDQS90, IDQS180, IDQS270, where the pair of divided data strobe signals includes a divided data strobe signal and a divided inverted data strobe signal. The edge-synchronized phase detector 259 detects the phase of the recovered clock signal RCLK in response to the pair of signals. For example, the pair of divided data strobe signals may include the first divided data strobe signal IDQS0 and the third divided data strobe signal IDQS180 or the pair of divided data strobe signals may include the second divided data strobe signal IDQS90 and the fourth divided data strobe signal IDQS270. The selected pair of divided data strobe signals may be provided to the edge-synchronized phase detector 2590 as an edge data strobe signal QDQS and an inverted edge data strobe QDQSB for phase detection.

A divided data strobe signal may be selected from among the plurality of divided data strobe signals divided by the second divider 257 and the inverted version of the selected divided data strobe signal may be provided to the edge-synchronized phase detector 2590.

In an embodiment, the edge-synchronized phase detector 2590 may include a first edge trigger flip-flop 2591 and a second edge trigger flip-flop 2593.

The first edge trigger flip-flop 2591 generates the phase of the recovered clock signal RCLK in response to the rising edges of the edge data strobe signal QDQS. The second trigger flip-flops 2593 generates the phase of the recovered clock signal RCLK in response to the rising edges of the inverted edge data strobe signal QDQSB.

The first and second edge trigger flip-flops 2591, 2593 may be D flip-flops. The first edge trigger flip-flop 2591 stores the recovered clock signal RCLK that the first edge trigger flip-flop 2591 receives as an input and generates the stored value of the recovered clock signal RCLK in response to a rising edge of the edge data strobe signal QDQS. The second edge trigger flip-flop 2593 stores the recovered clock signal RCLK that the second edge trigger flip-flop 2593 receives as an input and generates the stored value of the recovered clock signal RCLK in response to a rising edge of the inverted edge data strobe signal QDQSB.

The first edge trigger flip-flop 2591 provides the phase of the recovered clock signal RCLK in response to the rising edge of the edge data strobe signal QDQS as a first detected phase LAT0 to the detection result outputter 2595. In an embodiment, the first edge trigger flip-flop 2591 may also provide an inverted first detected phase LATT0 to the detection result outputter 2595.

The second edge trigger flip-flop 2593 provides the phase of the recovered clock signal RCLK in response to the rising edge of the inverted edge data strobe signal QDQSB as a second detected phase LAT1 to the detection result outputter 2595. In an embodiment, the second edge trigger flip-flop 2593 may also provide an inverted second detected phase LATT1 to the detection result outputter 2595.

The detection result outputter 2595 selectively provides the first detected phase LAT0 and the second detected phase LAT1 as the phase detection result PD.

The detection result outputter 2595 may include a driving section. The driving section includes complementary PMOS transistors MP1, MP2, complementary NMOS transistors MN1, MN2, and a latch circuit I3, I4. The complementary PMOS transistors MP1, MP2 and the complementary NMOS transistors MN1, MN2 are electrically coupled alternately in series. A latch node LN is electrically coupled to a first intermediate node between the PMOS transistor MP1 and the NMOS transistor MN1, and to a second intermediate node between the PMOS transistor MP1 and the NMOS transistor MN2. The latch circuit I3, I4 is electrically coupled to a latch node LN.

Figure 7:
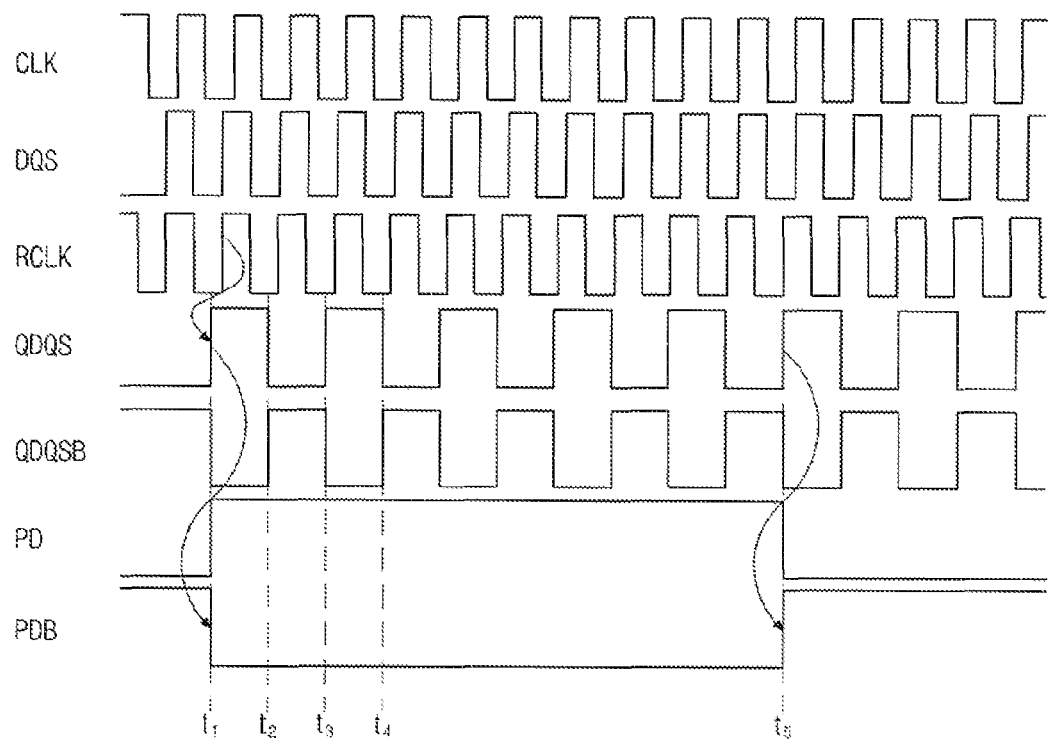
FIG. 7 is a timing diagram illustrating the relationship between the signals associated with the operations of an embodiment of the phase detection device.

FIG. 7 is a timing diagram illustrating the relationship between the signals associated with the operations of an embodiment of the phase detection device 250.

The operations of an embodiment of the phase detection device 250 will be described below with reference to FIGS. 3 to 7.

The clock signals CLK, CLKB and the external data strobe signals DQS, DQSB are provided to the memory apparatus 200 from the controller 100. The memory apparatus 200 includes a plurality of operation units 210. A phase detection device 250 is disposed in each of the plurality of operation units 210. The divided clock signals ICLK0, ICLK90, ICLK180, ICLK270 are divided from the clock signals CLK and CLKB. The phase detection device 250 generates the recovered clock signal RCLK based on the divided clock signals ICLK0, ICLK90, ICLK180, ICLK270.

Referring to FIG. 7, the clock signals CLK, CLKB and the recovered clock signal RCLK have substantially the same frequencies but different phases.

The divided data strobe signals IDQS0, IDQS90, IDQS180, IDQS270 are divided from the external data strobe signals DQS, DQSB. The edge data strobe signal QDQS and the inverted edge data strobe signal QDQSB are selected from among the divided data strobe signals IDQS0, IDQS90, IDQS180, IDQS270 and do not have the same phases as the external data strobe signals DQS and DQSB. The phase differences are attributable to a number of different factors including, but not limited to, the coupling of signals provided from the controller 100 to the memory apparatus 200, and the buffer characteristics of the individual operation units 210.

At a time t1, the edge-synchronized phase detector 2590 provides the first detected phase LAT0 of a logic low state corresponding to the phase of the recovered clock signal RCLK to the first PMOS transistor MP1 in response to the rising edge of the edge data strobe signal QDQS. Since the inverted first detected phase LATT0 corresponds to a logic high state, the first PMOS transistor MP1 and the first NMOS transistor MN1 are turned on and the phase detection result PD corresponding to a logic high state is outputted to a latch node LN.

The same value may be stored in the latch circuit as that which is generated by a third inverter 13 and a fourth inverter 14.

At a time t2, the second edge trigger flip-flop 2593 detects the phase of the recovered clock signal RCLK in response to the rising edge of the inverted edge data strobe signal QDQSB. Since the recovered clock signal RCLK still corresponds to the logic low state, the second detected phase LAT1 corresponding to a logic low state and the inverted second detected phase LATT1 corresponding to a logic high state are provided to the gate terminals of the second PMOS transistor MP2 and the second NMOS transistor MN2, respectively.

Since the second PMOS transistor MP2 and the second NMOS transistor MN2 are turned on and the latch node LN corresponds to the logic high state, the phase detection result PD is not changed.

At a time t3, the edge-synchronized phase detector 2590 detects the phase of the recovered clock signal RCLK in response to the edge data strobe signal QDQS. At a time t4, the phase of the recovered clock signal RCLK is detected in response to the inverted edge data strobe signal QDQSB.

At both the times t3 and t4, since the recovered clock signal RCLK corresponds to the logic low state, the phase detection result PD is retained at the logic high state. Through this process it is possible to achieve the effect that phases are detected at both the rising edge and the falling edge of the edge data strobe signals QDQS. Since the recovered clock signal RCLK has substantially the same frequency as the clock signals CLK, CLKB, the controller 100 may be able to correct a phase based on a phase detection result.

At a time t5, as a result of detecting the phase of the recovered clock signal RCLK in response to the edge data strobe signal QDQS by the first edge trigger flip-flop 2591, it is determined that the phase of the recovered clock signal RCLK corresponds to a logic high state.

Since the first detected phase LAT0 corresponds to a logic high state and the inverted first detected phase LATT0 corresponds to a logic low state, the first PMOS transistor MP1 and the second NMOS transistor MN1 are turned off.

The phase detection result PD transitions to a logic low state. Since the phase detection result PD is changed at the time t5, the controller 100 may determine that phase synchronization is likely to occur before or after the time t5.

The clock signals CLK, CLKB provided by the controller 100 are signals prior to the generation of the divided clock signals ICLK0, ICLK90, ICLK180, ICLK270. If a phase is detected using one of the divided clock signals ICLK0, ICLK90, ICLK180, ICLK270 instead of the recovered clock signal RCLK, a problem may arise when the logic state of a divided clock signal is high because a distance to the rising edge or the falling edge of the divided clock signal is not known.

In an embodiment of the phase detection device 250, since the divided clocks ICLK0, ICLK90, ICLK180, ICLK270 are generated as the recovered clock signal RCLK, where the recovered clock signal RCLK has substantially the same frequency as the original clock signals CLK, CLKB, a phase may be detected and the phases of the clock signals CLK, CLKB and the external data strobe signals DQS, DQSB may be synchronized.

Figure 8:
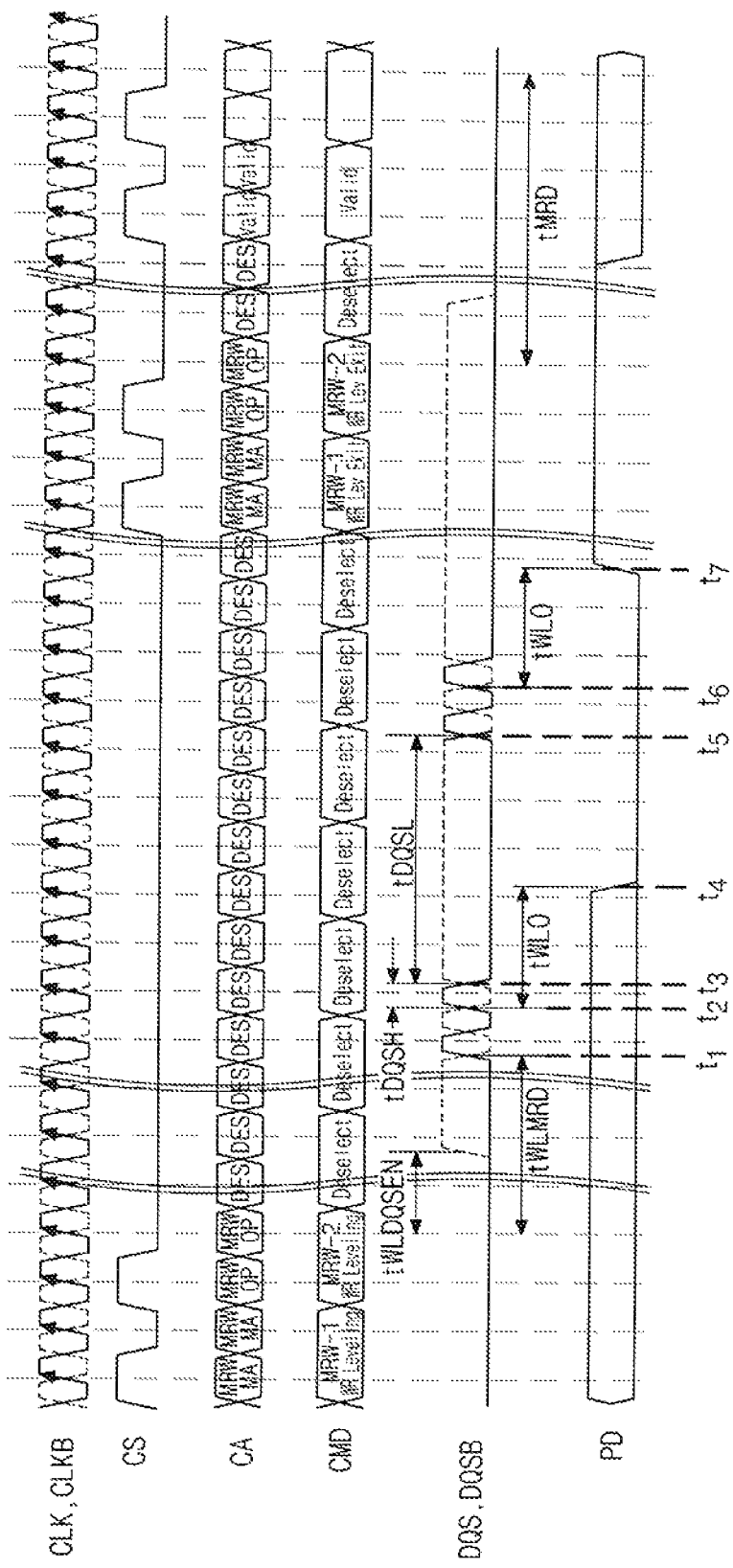
FIGS. 8 and 9 are timing diagrams illustrating an example of the relationship between the signals associated with the operations of an embodiment of the phase detection system.
Figure 9:
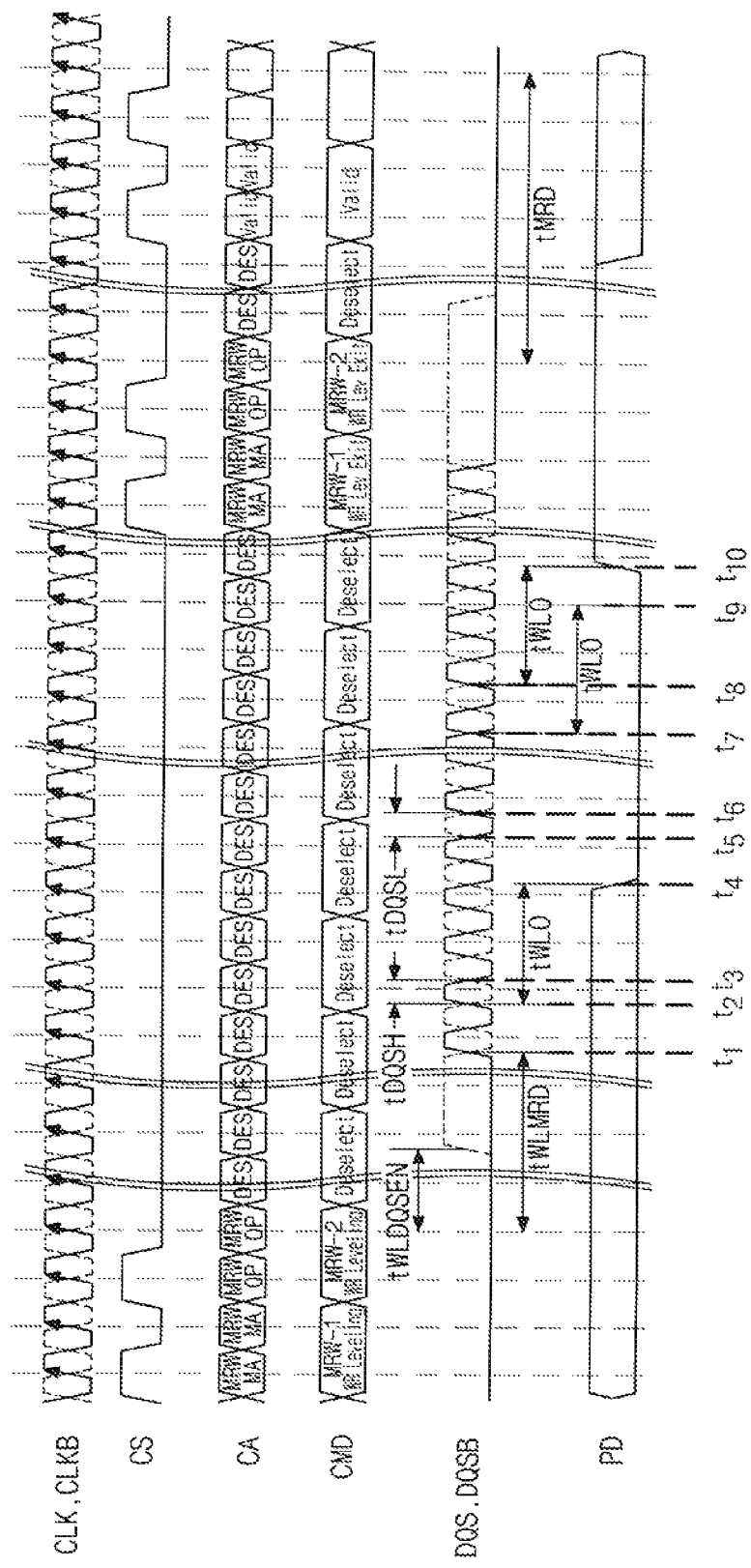

Referring to FIGS. 8 and 9 timing diagrams illustrating an example of the relationship between the signal associated with the operations of an embodiment of the phase detection system 10 are shown.

The memory apparatus 200 uses the clock signals CLK, CLKB and the external data strobe signals DQS, DQSB received from the controller 100 after dividing the clock signals CLK, CLKB and the external data strobe signals DQS, DQSB. This is because the transition speed of the signals received from the controller 100 is relatively high.

It may not be easy to detect the edges of signals that transition at a relatively high speed since the signals may be distorted due to factors such as for example signal integrity. In the case where the phase of the recovered clock signal RCLK is detected in response to the external data strobe signals DQS, DQSB, improper detection of the edges of the external data strobe signals DQS and DQSB may impact the precision of the phase detection.

The controller 100 and the memory apparatus 200 are electrically coupled via signal coupling lines. If the external data strobe signals DQS, DQSB have a pulse, a rising edge of a pulse following a logic low state that has been maintained for a predetermined time may result in a distortion of the external data strobe signals DQS and DQSB. When the external data strobe signals DQS, DQSB have a rising edge following a logic low state that has been maintained for a time that is relatively shorter than the predetermined time, the impact of the distortion of the external data strobe signals DQS, DQSB may be reduced.

The phase detection for the recovered clock signal RCLK is performed by excluding the distorted signals of the external data strobe signals DQS, DQSB and by using the rising edges of the signal following the distorted signals.

The external data strobe signals DQS, DQSB have pulses or rising edges. While pulses have no substantial retention times, the external data strobe signals DQS, DQSB, the divided data strobe signals IDQS0, IDQS90, IDQS180, IDQS270, the edge data strobe signal QDQS and the inverted edge data strobe signal QDQSB generated based on the external data strobe signals DQS, DQSB have predetermined high level periods and low level periods. The high level periods correspond to periods in which a logic high state is retained, that is, pulse duration periods. The low level periods correspond to periods in which a logic low state is retained, that is, periods in which pulses are not generated.

After the phase detection mode is entered in response to the command signal, the phase detector 259 in the phase detection device 250 ignores a first pulse of the external data strobe signals DQS, DQSB, and detects a phase from the rising edge of a second pulse. A first rising edge may correspond to the first pulse of the external data strobe DQS.

For example, the first pulse of the external data strobe signal DQS may be removed from the second buffer 253 and not be provided to the second divider 257 or the divided data strobe signals IDQS0, IDQS90, IDQS180, IDQS270 may be generated by ignoring the first pulse of the external data strobe signal DQS in the second divider 257.

The operation of ignoring the first pulse of the external data strobe signal DQS may be performed by a separate control unit (not shown) in the phase detection device 250 or the controller 100 may provide a control signal to the phase detection device 250 to not perform phase detection using the first pulse of the external data strobe signal DQS.

The controller 100 issues the external data strobe signal DQS provided after the phase detection mode is entered, with two rising edges (that is, pulses) within the predetermined time. In an embodiment, the interval between the two rising edges may be substantially the same as one cycle of the clock signals CLK, CLKB.

A first rising edge may be defined as a first pulse after the phase detection mode is entered. A first rising edge may be defined as the rising edge of a pulse that is generated after the external data strobe signal DQS has been issued in a low logic state for a period of time substantially equal to or longer than the predetermined of time after the phase detection mode is entered.

In the case where the external data strobe signal DQS rises after being issued with the logic low state for the predetermined time, the next rising edge is ignored and phase detection is performed based on the following rising edge. The performance of the phase detection following the relative stabilization of one or more characteristics of the signal may result in the precision of phase detection being improved.

The phase detector 259 detects the time interval between a current rising edge and an immediately previous rising edge of the external data strobe signal DQS. The phase detector 259 does not perform phase detection based on the current rising edge when the time interval between the rising edges is substantially equal to or longer than the predetermined time. The phase detector 259 may not perform phase detection for one of the divided data strobe signals IDQS0, IDQS90, IDQS180, IDQS270, where the divided data strobe signals IDQS0, IDQS90, IDQS180, IDQS270 are generated based on such an external data strobe signal DQS.

In an embodiment, the second buffer 253 may not generate the internal data strobe signal IDQS for the first rising edge of the external data strobe signal DQS. The second divider 257 may ignore the first rising edge of the external data strobe signal DQS when generating the divided data strobe signals IDQS0, IDQS90, IDQS180, IDQS270.

The high logic level period and the low logic level period of the external data strobe signal DQS may be received from an external device. For example, the controller 100 may include information on the high logic level period and the low logic level period for generation of the external data strobe signal DQS. The phase detector 259 may receive the information on the high logic level period and the low logic level period of the external data strobe signal DQS from the controller 100. A method for ignoring a specific rising edge may be altered based on a duration of the low period.

FIG. 8 provides detail associated with the case where a low logic level period tDQSL of the external data strobe signal DQS is designated as a maximum value. FIG. 9 provides detail associated with the case where a low logic level period tDQSL of the external data strobe signal DQS is designated as a minimum value.

Referring to FIG. 8, the clock signals CLK, CLKB may be complementary signals that may be differentially provided to the memory apparatus 200. The performance of the phase detection operation using differential operations may improve the relative precision of detecting the phases of the clock signals CLK, CLKB. For example, the phase detector 259 of FIG. 3 may perform the phase detection based on the differential clock signals CLK, CLKB and based on the differential external data strobe signals DQS, DQSB.

The operation unit 210 in the memory apparatus 200 may be selected according to a chip select signal CS.

Upon receipt of a command signal CMD, the phase detection mode for performing the phase detection for the clock signals CLK, CLKB and the external data strobe signal DQS is entered. In an embodiment, the phase detection mode may include write leveling. Write leveling may be defined as an operation, where the phases of the recovered clock signal RCLK and at least one of the divided data strobe signals IDQS0, IDQS90, IDQS180, IDQS270 are detected. The divided data strobe signals IDQS0, IDQS90, IDQS180, IDQS270 are based on the external data strobe signal DQS. The generation times of the external data strobe signals DQS, DQSB are adjusted to generally synchronize the phases of the clock signals CLK, CLKB and the external data strobe signals DQS, DQSB. For example, write leveling may be performed before a training operation.

At a time t1 when after a predefined period of time has passed following the receipt of the command signal CMD, the external data strobe signal DQS transitions from the logic low state to the logic high state. In other words, the first pulse is provided. The rising edge of the first pulse of the external data strobe DQS at the time t1, may be difficult to properly detect.

The phase detector 259 of FIG. 3 ignores the first rising edge of the external data strobe signal DQS at the time t1. The phase detector 259 detects the phases of the clock signals CLK, CLKB in response to the rising edge of a pulse of the external data strobe signal DQS at a time t2.

For the external data strobe signal DQS, a high level period tDQSH and a low level period tDQSL may be defined. Activation of a phase detecting operation may occur when the low level period tDQSL is substantially equal to or longer than the predetermined time period. The time interval between the consecutive rising edges of the external data strobe signal DQS corresponds to a value obtained by adding the high level period tDQSH to the low level period tDQSL. The time interval may be used as a reference for the predetermined time period.

For example, the activation of the phase detecting operation is based on whether the low level period tDQSL is a first time. The interval between the consecutive rising edges of the external data strobe signal DQS may correspond to a value obtained by adding the first time and the predefined high level period tDQSH. The time interval between the consecutive rising edges of the external data strobe signal DQS obtained in this manner is referred to as a second time.

The phase detector 259 may perform the phase detecting operation based on the information received from the controller 100 regarding the interval between the consecutive rising edges after the phase detection mode has been entered in response to the command signal CMD.

After the phase detection mode has been entered in response to the command signal CMD, the first rising edge of the external data strobe signal DQS at the time t1 is ignored. At the time t2, since the interval between a current rising edge and an immediately previous rising edge is relatively shorter than the second time, the phase detector 259 may utilize the external data strobe signal DQS to perform the phase detection of the recovered clock signal RCLK.

In an embodiment, the interval between the first rising edge and the second rising edge of the external data strobe signal DQS (the time period between the time t1 and the time t2 in FIG. 8) may be substantially the same as the cycle of the clock CLK.

At a time t3, the external data strobe signal DQS transitions from the logic high state to the logic low state. The time t3 may correspond to a falling edge. The period between the time t2 and the time t3 is referred to as the high level period tDQSH. The high level period tDQSH may correspond to a period during which the external data strobe signal DQS has the logic high state or a pulse duration period.

The phase detector 259 may detect the phases of the clock signals CLK, CLKB at the time t2 and may provide the phase detection result PD to the controller 100 at a time t4. The phase detection result PD may be generated by detecting the phase of the recovered clock signal RCLK. The recovered clock signal RCLK is recovered after the internal clock signal ICLK is divided by the first divider 255. In an embodiment, the phase detection result PD may be provided to the controller 100 via a data input/output pin (DQ).

The low level period defined for the external data strobe signal DQS may be the time period between the time t3 and a time t5. The low level period may correspond to a period during which the external data strobe signal DQS has a logic low state.

If the low level period of the external data strobe signal DQS is substantially equal to or longer than the predetermined time period, for example, the first time, it may be difficult to perform phase detection for the signals based on the external data strobe signal DQS that is provided to the memory apparatus 200 following the low level period that is substantially equal to the first time.

The phase detector 259 ignores the rising edge of the external data strobe signal DQS at the time t5 and performs phase detection for the first control signal CON1 in response to the rising edge of the second control signal CON2 at a time t6.

In an embodiment, the function of ignoring a specified pulse or rising edge of the external data strobe signal DQS may be performed by the second buffer 253, the second divider 257 or the phase detector 259.

The second buffer 253 may not provide a specified pulse or rising edge of the external data strobe signal DQS as the internal data strobe signal IDQS via a separate control configuration. In an embodiment, the second divider 257 may not perform a dividing operation for a specified pulse or rising edge of the internal data strobe signal IDQS.

The phase of the recovered clock signal RCLK is detected at the time t6. At a time t7 corresponding to when a preset time tWLO has elapsed following the time t6, the phase detection result PD transitions to the logic high state.

The period between the time t5 and the time t6 may be substantially the same as the cycle of the clock signals CLK, CLKB or the recovered clock signal RCLK.

The controller 100 may advance or delay the pulse generation times of the external data strobe signals DQS, DQSB based on the phase detection result PD.

In an embodiment of the phase detection method, signal integrity and characteristics of the second buffer 253 may impact the relative precision with which the phases of the initially provided external data strobe signals DQS, DQSB are detected. The controller 100 provides the external data strobe signals DQS, DQSB having two rising edges within a predefined time period, such as for example, the second time.

The second rising edge of the external data strobe signals DQS, DQSB may enable relatively more precise phase detection. The second rising edge may be defined as a second rising edge following the receipt of the command signal CMD or a second rising edge following the low level period of the external data strobe signals DQS, DQSB where the low level period is set to be substantially equal to or longer than the predetermined time. The predetermined time may, for example, be the first time.

Referring to FIG. 9 a timing diagram providing detail associated with the case where the low level period of the external data strobe signals DQS, DQSB is not substantially equal to or longer than the predetermined time period is shown.

The process from when the command signal CMD is received at the phase detection system 10 to the time t3 when the second rising edge of the external data strobe signal DQS is received at the phase detection system 10 is similar to the process described with respect to FIG. 8.

In FIG. 9, the low level period of the external data strobe signal DQS received at the time t3 following when the second rising edge is substantially equal to or shorter than the predetermined time. An example of the predetermined time is the first time. In FIG. 9, the low level period of the external data strobe signal DQS is set as the period between a time t5 and a time t6.

The phase detector 259 continuously detects the phase of the recovered clock signal RCLK in response to at least one of the divided data strobe signals IDQS0, IDQS90, IDQS180, IDQS270 where the divided data strobe signals IDQS0, IDQS90, IDQS180, IDQS270 are generated based on the external data strobe signal DQS. A phase detection result based on the second rising edge at the time t2 is generated as the phase detection result PD at a time t4 corresponding to when a predetermined time period has passed.

The phase difference between the recovered clock signal RCLK and at least one of the divided data strobe signals IDQS0, IDQS90, IDQS180, IDQS270, where the divided data strobe signals IDQS0, IDQS90, IDQS180, IDQS270 are based on the rising edge of the external data strobe signal DQS at a time t7 is generated at a time t9. The phase of the recovered clock signal RCLK is detected based on at least one of the divided data strobe signals IDQS0, IDQS90, IDQS180, IDQS270 where the divided data strobe signals IDQS0, IDQS90, IDQS180, IDQS270 are based on the rising edge of the external data strobe signal DQS at a time t8. The phase of the recovered clock signal RCLK is provided as the phase detection result PD at a time t10.

Since a phase detection result of the recovered clock signal RCLK detected from the time t4 to the time t10 and a phase detection result of the recovered clock signal RCLK detected at the time t8 are different from each other, the phase detection result PD at the time t10 transitions from the logic low state to the logic high state.

Referring to FIG. 9, in the case where the low level period between the consecutive rising edges of the external data strobe signals DQS, DQSB is set to be relatively shorter than the predetermined time period, the phase detection may be performed repeatedly in response to at least one of the divided data strobe signals IDQS0, IDQS90, IDQS180, IDQS270, where the divided data strobe signals IDQS0, IDQS90, IDQS180, IDQS270 are based on the rising edge of the external data strobe signal DQS. An example of the predetermined time period is the first time. Since the phases of the external data strobe signals DQS, DQSB suffer from relatively less distortion due to signal integrity or the characteristics of reception buffers, all of the rising edges are used for phase detection, with the exception of the divided data strobe signals IDQS0, IDQS90, IDQS180, IDQS270 generated based on the first rising edge of the external data strobe signal DQS in response to the command signal CMD.

In an embodiment, the phase detection method and the phase detection device perform the phase detection in the case where the time interval between a current rising edge and a previous rising edge of the external data strobe signal DQS after the phase detection mode is entered is relatively shorter than the predetermined time period. An example of the predetermined time period is the second time. For example, the phase detection may not be performed in the case where a current rising edge is the first rising edge of the external data strobe signal DQS or the low level period of the external data strobe signal DQS is set to be substantially equal to or relatively longer than the predetermined time period. An example of the predetermined time period is the first time. The time interval between a current rising edge and a previous rising edge is substantially equal to or relatively longer than the predetermined time period following the receipt of the command signal CMD. An example of the predetermined time period is the second time.

Figure 10:
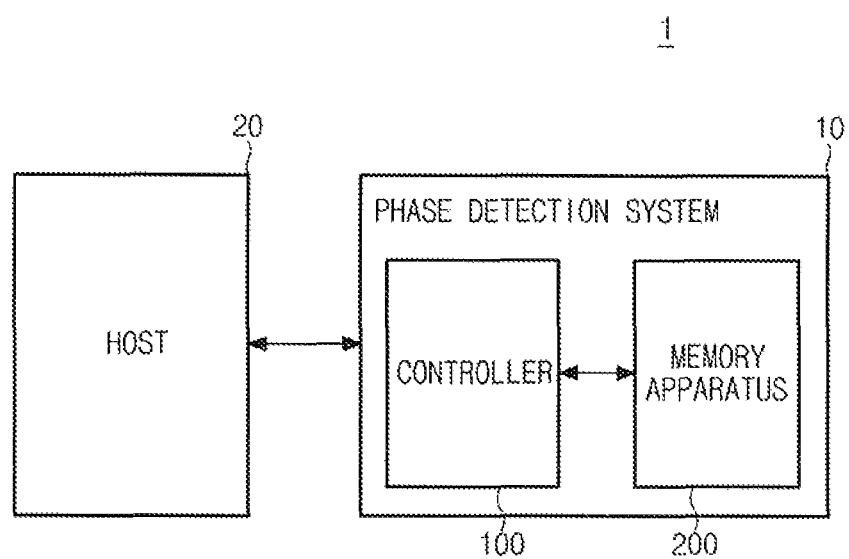
FIG. 10 is a block diagram illustration of an electronic apparatus including an embodiment of the phase detection system.

FIG. 10 is a block diagram representation of an electronic apparatus 1 including an embodiment of the phase detection system 10.

The electronic apparatus 1 may include a host 20 and the phase detection system 10.

The phase detection system 10 may have the same configuration and operational characteristics as described above with reference to FIGS. 1 to 9.

In an embodiment, the electronic apparatus 1 may include the controller 100. The controller 100 may receive from a host 20 a signal associated with an operation mode. The controller 100 may generate a command signal CMD in response to the signal received from the host 20 and provide the command signal CMD to the memory apparatus 200. The operation units 210 disposed in the memory apparatus 200 may operate in accordance with the received command signal CMD.

In an embodiment, the operation unit 210 may perform the phase detecting operation performed by the phase detection device 250 as well as data write/read operations. The data write/read operations may be performed when a memory for storing data is provided in each operation unit 210. The memory may include at least one of a volatile memory and a nonvolatile memory.

The data write/read operations may be performed in accordance with an operation mode command received from the host 20. The data write/read operations may be performed in accordance with commands generated internally by the controller 100.

In an embodiment of the phase detection system 10, after the clock signals CLK, CLKB and the external data strobe signals DQS, DQSB having relatively high transition speeds are provided by the controller 100 and are divided by the memory apparatus 200, the recovered clock signal RCLK is generated by recovering the divided clock signals ICLK0, ICLK90, ICLK180, ICLK270, and then the phase detecting operation may be performed. For the phase detection, a pulse with relatively good signal characteristics may be selectively used from the external data strobe signals DQS, DQSB. Phase detection characteristics may be improved, and phase errors associated with the operation of the electronic apparatus 1 may be relatively lower.

If phase errors associated with the operation of the electronic apparatus 1 are decreased, the reliability of the entire operations may be improved. In the case where the electronic apparatus 1 operates at a relatively higher operation speed there may be improvements in the relative precision of the phase detection.

Figure 11:
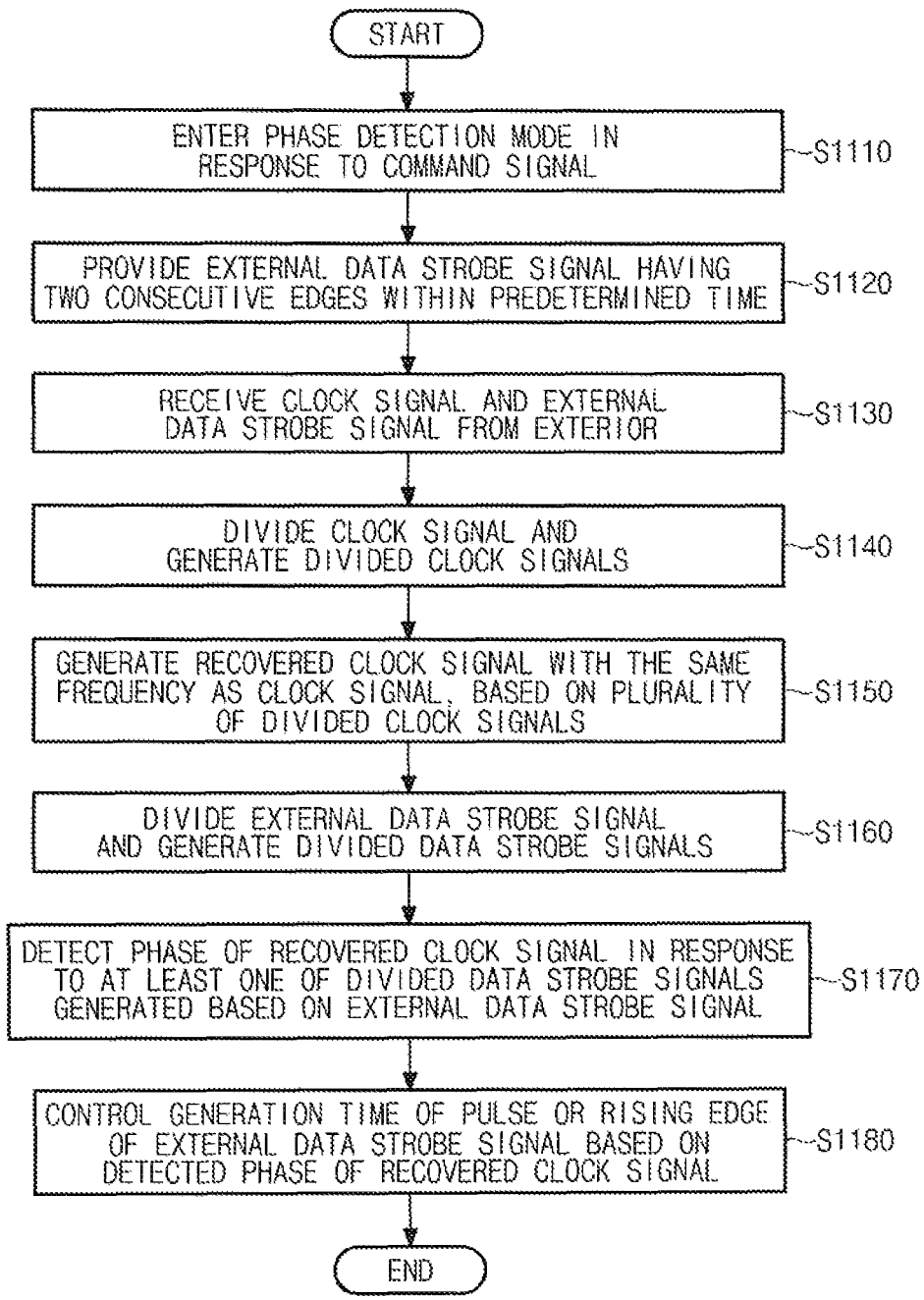
FIG. 11 is a flow chart illustration of an embodiment of a phase detection method.

FIG. 11 is a flow chart representation of an embodiment of a phase detection method.

The clock signals CLK, CLKB and the external data strobe signals DQS, DQSB are received from an external device (step S1130). In an embodiment, the phase detection device 250 is disposed in the memory apparatus 200 and may receive the differential clock signals CLK, CLKB and the differential external data strobe signals DQS, DQSB from the controller 100. In an embodiment, the phase detection device 250 may receive a single clock signal CLK and a single the external data strobe signal DQS from the controller 100.

The received clock signals CLK, CLKB are provided to the first divider 255 via the first buffer 251. The first buffer 255 divides the received clock signals CLK, CLKB and generates the plurality of divided clock signals ICLK0, ICLK90, ICLK180, ICLK270 (step S1140).

The recoverer 258 generates the recovered clock signal RCLK having substantially the same frequency as the clock signals CLK, CLKB based on the plurality of divided clock signals ICLK0, ICLK90, ICLK180, ICLK270 (step S1150). The recoverer 258 may generate the recovered clock signal RCLK by performing a NAND operation for the plurality of divided clock signals ICLK0, ICLK90, ICLK180, ICLK270.

The phase detector 259 detects the phase of the recovered clock signal RCLK in response to at least one of the divided data strobe signals IDQS0, IDQS90, IDQS180, IDQS270, where the divided data strobe signals IDQS0, IDQS90, IDQS180, IDQS270 are generated based on the external data strobe signals DQS, DQSB (step S1170). In an embodiment, the phase detector 259 may generate the phase detection result PD based on the detected phase of the recovered clock signal RCLK and provide the phase detection result PD to the controller 100. For example, the phase detection result PD may be transmitted to the controller 100 via the DQ pad of the memory apparatus 200 that includes the phase detection device 250.

The controller 100 may adjust the generation times of the pulses or the rising edges of the external data strobe signals DQS, DQSB, based on the phase detection result PD (step S1180). By repeating this process, the phases of the external data strobe signals DQS, DQSB and the clock signals CLK, CLKB that are received at the phase detection device 250 may be generally synchronized with respect to each other.

In an embodiment, the second divider 257 may divide the external data strobe signals DQS, DQSB and generate the divided data strobe signals IDQS0, IDQS90, IDQS180, IDQS270 (step S1160).

In an embodiment of the phase detection method, when the phase detection method is based on the external data strobe signal DQS, the phase detection is performed by ignoring a specified pulse of the external data strobe signal DQS.

In an embodiment, the phase detection system 10 enters the phase detection mode in response to the command signal CMD received from the host 20 (step S1110).

After the phase detection system 10 enters the phase detection mode, the controller 100 provides the external data strobe signal DQS to the phase detection system 10. The external data strobe signal DQS has two rising edges generated within the predetermined time period. The first pulse of the external data strobe signal DQS may be distorted (step S1120).

When the two consecutive rising edges of the external data strobe signal DQS is received at the phase detection system 10, the second buffer 253 may ignore the first rising edge and may provide the external data strobe signal DQS as the internal data strobe signal IDQS to the second divider 257 starting with the second rising edge of the received external data strobe signal DQS.

In an embodiment, when both of the two consecutive rising edges of the external data strobe signal DQS is provided to the second divider 257 as the internal data strobe signal IDQS, the second divider 257 may ignore the first rising edge of the internal data strobe signal IDQS and perform a dividing operation starting with the second rising edge of the internal data strobe signal IDQS.

In an embodiment, the phase detector 259 may perform a phase detecting operation by ignoring signals based on the first rising edge of the external data strobe signal DQS.

In an embodiment, while the memory apparatus 200 may perform a phase detecting operation regardless of the characteristic of the external data strobe signal DQS, the controller 100 may discard the phase detection result provided by the phase detection system 10 based on the first rising edge of the external data strobe signal DQS.

The phase detection device and the phase detection method may reduce the impact of relatively poor signal characteristics of a pulse provided after a low logic state has been maintained for a predetermined time period. A control signal having two consecutive pulses may be provided to the phase detection system 10 after a phase detection mode is entered. The phase detection is implemented by ignoring the first pulse and using the next pulse.

Embodiments of the phase detection method and the phase detection system may reduce the impact of potentially poor signal characteristics of a pulse provided after a low logic state is maintained for a predetermined time. A control signal having two consecutive pulses after a phase detection mode is entered is provided and the phase detection is implemented by ignoring the first pulse and using the next pulse.

Embodiments of the phase detection method and the phase detection system may improve the precision of phase detection and errors due to a phase mismatch may be minimized. Use of embodiments of the phase detection method and phase detection system may improve operational reliability.

Embodiments of the phase detection system may be may be used in relatively small-sized electronic appliances that perform high-speed operations.

While certain embodiments have been described above, it will be understood to those skilled in the art that the embodiments described are by way of example only. Accordingly, the phase detection device and the phase detection method described herein should not be limited based on the described embodiments. Rather, the phase detection device and the phase detection method described herein should only be limited in light of the claims that follow when taken in conjunction with the above description and accompanying drawings.

What is claimed is:

1. A phase detection device comprising:
   a clock divider configured to divide a clock signal and generate a plurality of divided clock signals;
   a recoverer configured to generate a recovered clock signal having substantially the same frequency as the clock signal based on the plurality of divided clock signals; and
   a phase detector configured to detect a phase of the recovered clock signal in response to a data strobe signal.

2. The phase detection device according to claim 1, further comprising:
   a data strobe divider configured to divide an external data strobe signal and generate the data strobe signal.

3. The phase detection device according to claim 1, wherein the clock signal comprises a pair of differential clock signals including a clock signal and an inverted clock signal.

4. The phase detection device according to claim 1, wherein the recoverer is configured to generate the recovered clock signal by performing an AND operation for the plurality of divided clock signals.

5. A phase detection system comprising:
   a controller configured to generate a clock signal and an external data strobe signal; and
   a phase detection device configured to receive the clock signal and the external data strobe signal, responsively generate a plurality of divided clock signals and a plurality of data strobe signals, generate a recovered clock signal having substantially the same frequency as the clock signal based on the plurality of divided clock signals, detect a phase of the recovered clock signal based on the plurality of data strobe signals, and generate a phase detection result.

6. The phase detection system according to claim 5, wherein the controller determines a generation time of the external data strobe signal based on the phase detection result.

7. The phase detection system according to claim 5, wherein the phase detection device comprises:
   a clock divider configured to divide the clock signal received from the controller, and generate the plurality of divided clock signals;
   a recoverer configured to generate the recovered clock signal based on the plurality of divided clock signals;
   a data strobe divider configured to divide the external data strobe signal and generate the plurality of data strobe signals; and
   a phase detector configured to detect a phase of the recovered clock signal in response to the plurality of data strobe signals.

8. The phase detection system according to claim 5, wherein the controller provides a pair of differential clock signals and a pair of differential external data strobe signals, wherein the pair of differential clocks signals comprises a pair of complementary clock signals and the pair of differential external data strobe signals comprises a pair of complementary external data strobe signals.

9. The phase detection system according to claim 5, wherein the phase detection device divides the clock signal by two and the external data strobe signal by two.

10. The phase detection system according to claim 9, wherein the divided clock signals are generated as the recovered clock signal based on an AND operation.

11. The phase detection system according to claim 5, wherein, after a phase detection mode is entered based on a received command signal, the controller ignores a result of the phase detection of the recovered clock signal generated in response to a first edge of the plurality of data strobe signals.

12. The phase detection system according to claim 11, wherein the received command signal is a write leveling mode signal.

13. The phase detection system according to claim 5,
   wherein a plurality of phase detection devices are disposed in a memory apparatus, and
   wherein, when the memory apparatus is electrically coupled with the controller via a first signal coupling line and via a plurality of second signal coupling lines, and wherein the clock signal is provided to the plurality of phase detection devices via the first signal coupling line, and the external data strobe signal is provided to the plurality of phase detection devices via the plurality of second signal coupling lines.

14. A phase detection method comprising:
   receiving a clock signal and an external data strobe signal;
   dividing the received clock signal to generate a plurality of divided clock signals;
   generating a recovered clock signal having substantially the same frequency as the clock signal based on the plurality of divided clock signals; and
   detecting a phase of the recovered clock signal based on the external data strobe signal.

15. The phase detection method according to claim 14, further comprising:
   adjusting a generation time of the external data strobe signal based on a detected phase of the recovered clock signal.

16. The phase detection method according to claim 14, further comprising:
   generating a plurality of divided data strobe signals based on the external data strobe signal, wherein detecting the phase comprises detecting a phase of the recovered clock signal based on the divided data strobe signals.

17. The phase detection method according to claim 14, further comprising:

entering a phase detection mode in response to a command signal;

processing the received clock signal and the received external data strobe signal when in the phase detection mode, wherein, the phase of the recovered clock signal is detected by ignoring a first edge of the external data strobe signal.

18. The phase detection method according to claim 14, the method further comprises:

entering a phase detection mode in response to a command signal;

receiving the clock signal and the external data strobe signal in the phase detection mode; and providing an external data strobe signal having two consecutive edges within a predetermined time after entering the phase detection mode.

19. The phase detection method according to claim 14, further comprising:

entering a phase detection mode in response to a command signal;

receiving the clock signal and the external data strobe signal in the phase detection mode;

detecting a phase of the recovered clock signal; and determining whether a phase of the recovered clock signal is substantially similar to a phase of the external data strobe signal;

ending the phase detection mode based on the determination.

20. The phase detection method according to claim 14, wherein the dividing of the clock signal comprises:

receiving the clock signal as a pair of differential clock signals; and dividing each of the received differential clock signals by two, and wherein dividing the external data strobe signal comprises:

receiving the external data strobe signal as a pair of differential external data strobe signals; and dividing each of the received differential external data strobe signals by two.

\* \* \* \* \*